(12) United States Patent
Manning

(10) Patent No.: US 7,534,694 B2
(45) Date of Patent: *May 19, 2009

(54) METHODS OF FORMING A PLURALITY OF CAPACITORS

(75) Inventor: H. Montgomery Manning, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 87 days.

This patent is subject to a terminal disclaimer.

(21) Appl. No.: 11/477,957

(22) Filed: Jun. 28, 2006

(65) Prior Publication Data
US 2006/0246678 A1 Nov. 2, 2006

Related U.S. Application Data

(63) Continuation of application No. 10/929,037, filed on Aug. 27, 2004, now Pat. No. 7,439,152.

(51) Int. Cl.
H01L 21/20 (2006.01)

(52) U.S. Cl. ........................................ 438/397; 438/396

(58) Field of Classification Search .................. None
See application file for complete search history.

(56) References Cited

U.S. PATENT DOCUMENTS

| 4,517,729 A | 5/1985 | Batra |
| 5,236,860 A | 8/1993 | Fazan et al. |
| 5,340,763 A | 8/1994 | Dennison |
| 5,401,681 A | 3/1995 | Dennison |
| 5,467,305 A | 11/1995 | Bertin et al. |
| 5,498,562 A | 3/1996 | Dennison et al. |
| 5,532,089 A | 7/1996 | Adair et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,686,747 A | 11/1997 | Jost et al. |
| 5,702,990 A | 12/1997 | Jost et al. |

(Continued)

FOREIGN PATENT DOCUMENTS

DE 4447804 1/2002

(Continued)

OTHER PUBLICATIONS

Banhart, "Aluminum Foams: On the Road to Real Applications", Mrs Bulletin, pp. 290-295 (Apr. 2003).

(Continued)

Primary Examiner—Zandra Smith
Assistant Examiner—Khanh B Duong
(74) Attorney, Agent, or Firm—Wells St. John P.S.

(57) ABSTRACT

The invention includes methods of forming a plurality of capacitors. In one implementation, a plurality of capacitor electrode openings is formed over a substrate. Individual of the capacitor electrode openings are bounded on a first pair of opposing sides by a first capacitor electrode-forming material at one elevation and on a second pair of opposing sides by a different second capacitor electrode-forming material at the one elevation. Individual capacitor electrodes are formed within individual of the capacitor electrode openings. The capacitor electrodes are incorporated into a plurality of capacitors. Other aspects and implementations are contemplated.

32 Claims, 11 Drawing Sheets

U.S. PATENT DOCUMENTS

| | | | |
|---|---|---|---|
| 5,705,838 A | 1/1998 | Jost et al. |
| 5,767,561 A | 6/1998 | Frei et al. |
| 5,821,140 A | 10/1998 | Jost et al. |
| 5,869,382 A | 2/1999 | Kubota |
| 5,900,660 A | 5/1999 | Jost et al. |
| 5,955,758 A | 9/1999 | Sandhu et al. |
| 5,981,350 A | 11/1999 | Geusic et al. |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,133,620 A | 10/2000 | Uochi |
| 6,180,450 B1 | 1/2001 | Dennison |
| 6,204,143 B1 | 3/2001 | Roberts et al. |
| 6,204,178 B1 | 3/2001 | Marsh |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juengling |
| 6,372,554 B1 | 4/2002 | Kawakita et al. |
| 6,383,861 B1 | 5/2002 | Gonzalez et al. |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,617,222 B1 | 9/2003 | Coursey |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,812,513 B2 | 11/2004 | Geusic et al. |
| 6,822,261 B2 | 11/2004 | Yamazaki et al. |
| 6,844,230 B2 | 1/2005 | Reinberg |
| 6,849,496 B2 | 2/2005 | Jaiprakash et al. |
| 6,893,914 B2 | 5/2005 | Kim et al. |
| 6,897,109 B2 | 5/2005 | Jin et al. |
| 6,927,122 B2 | 8/2005 | Geusic et al. |
| 6,930,640 B2 | 8/2005 | Chung et al. |
| 7,042,040 B2 | 5/2006 | Horiguchi |
| 7,064,365 B2 | 6/2006 | An et al. |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,125,781 B2 | 10/2006 | Manning et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 2001/0012223 A1 | 8/2001 | Kohyama |
| 2001/0026974 A1 | 10/2001 | Reinberg |
| 2001/0044181 A1 | 11/2001 | Nakamura |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 | 5/2003 | Ito et al. |
| 2003/0153146 A1 | 8/2003 | Won et al. |
| 2003/0178684 A1 | 9/2003 | Nakamura |
| 2003/0190782 A1 | 10/2003 | Ko et al. |
| 2003/0227044 A1 | 12/2003 | Park |
| 2004/0018679 A1 | 1/2004 | Yu et al. |
| 2004/0056295 A1 | 3/2004 | Agarwal et al. |
| 2004/0150070 A1 | 8/2004 | Okada et al. |
| 2004/0188738 A1 | 9/2004 | Farnworth et al. |
| 2005/0051822 A1 | 3/2005 | Manning |
| 2005/0054159 A1 | 3/2005 | Manning et al. |
| 2005/0158949 A1 | 7/2005 | Manning |
| 2005/0287780 A1 | 12/2005 | Manning et al. |
| 2006/0014344 A1 | 1/2006 | Manning |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0186451 A1 | 8/2006 | Dusberg et al. |
| 2006/0211211 A1 | 9/2006 | Sandhu et al. |
| 2006/0261440 A1 | 11/2006 | Manning |
| 2006/0263968 A1 | 11/2006 | Manning |
| 2007/0032014 A1 | 2/2007 | Sandhu et al. |
| 2007/0048976 A1 | 3/2007 | Raghu |
| 2007/0099328 A1 | 5/2007 | Chiang et al. |
| 2007/0145009 A1 | 6/2007 | Fucsko et al. |

FOREIGN PATENT DOCUMENTS

| | | |
|---|---|---|
| JP | 08274278 | 10/1996 |
| JP | 10189912 | 7/1998 |
| JP | 11191615 | 7/1999 |
| JP | 2000196038 | 7/2000 |
| JP | 2003142605 | 5/2003 |
| JP | 2003-264246 | 9/2003 |
| JP | 2003273247 | 9/2003 |
| JP | 2003297952 | 10/2003 |
| JP | 2004111626 | 4/2004 |
| JP | 2004128463 | 4/2004 |
| KR | 20010061020 | 7/2001 |
| KR | 20010114003 | 12/2001 |
| KR | 1020030058018 | 7/2003 |
| KR | 1020050000896 | 1/2005 |
| WO | 2004/027898 | 8/2004 |
| WO | 2004/040252 | 12/2004 |
| WO | WO 2005/024936 | 3/2005 |

OTHER PUBLICATIONS

Crouse et al., *Self-Assembled Nanostructures Using Anodized Alumina Thin Films for Optoelectronic Applications*, IEEE, pp. 234-235 (1999).

Gibson et al., "Cellular Solids", Mrs Bulletin, pp. 270-274 (Apr. 2003).

Green et al., "*Cellular Ceramics: Intriguing Structures, Novel Properties, and Innovative Applications*", Mrs Bulletin, pp. 296-300 (Apr. 2003).

Green et al., "*The Structure and Applications of Cellular Ceramics*", Web Extra, 10 pages (Apr. 2003).

Karp et al., "*Scaffolds for Tissue Engineering*", Mrs Bulletin, pp. 301-306 (Apr. 2003).

Kim et al., "*A Mechanically Enhanced Storage node for virtually Height (MESH) Capacitor Aiming at sub 70nm DRAMs*", IEEE 2004, pp. 3.4.1-3.4.4 (2004).

Konovalov et al., "Chemistry of Materials", Chem Mater., vol. 11, No. 8, pp. 1949-1951 (Aug. 1999).

Kraynik, "*Foam Structure: From Soap Froth to Solid Foams*", Mrs Bulletin, pp. 275-276 (Apr. 2003).

Liang et al., "*Nonlithographic Fabrication of Lateral Superlattices for Nanometric Electromagnetic-Optic . . .*" IEEE J. Selected Topics in Quantum Electr., vol. 8, No. 5, pp. 998-1008 (Sep./Oct. 2002).

Liu et al., "*Ordered anodic alumina nanochannels on focused-ion-beam-prepatterned aluminum surfaces*", Appl. Phys. Lett., vol. 78, No. 1, pp. 120-122 (Jan. 2001).

Maire et al., "*In Situ X-Ray Tomography Measurements of Deformation in Cellular Solids*", Mrs Bulletin, pp. 284-289 (Apr. 2003).

Masuda et al., "*Highly ordered nanochannel-array architecture in anodic alumina*", App. Phys. Lett, vol. 71, No. 19, pp. 2770-2772 (Nov. 1997).

Nadeem et al., "Fabrication of Microstructures Using Aluminum Anodization Techniques", pp. 274-277 (pre-2004).

Oh et al., "*Preparation and Pore-Characteristics Control of Nano-Porous Materials Using Organometallic Building Blocks*", 4 Carbon Science, No. 1, pp. 1-9 (Mar. 2003).

U.S. Appl. No. 10/928,931, filed Aug. 2004, Busch et al.

U.S. Appl. No. 11/006,331, filed Dec. 6, 2004, Basceri et al.

U.S. Appl. No. 11/083,489, filed Mar. 18, 2005, Sandhu et al.

U.S. Appl. No. 11/131,552, filed May 18, 2005, Manning.

U.S. Appl. No. 11/131,575, filed May 18, 2005, Manning et al.

U.S. Appl. No. 11/196,593, filled Aug. 3, 2005, Sandhu et al.

U.S. Appl. No. 11/272,232, filed Nov. 10, 2005, Manning et al.

U.S. Appl. No. 11/272,247, filed Nov. 10, 2005, Manning et al.

Onck, "*Scale Effects in Cellular Metals*", Mrs Bulletin, pp. 279-283 (Apr. 2003).

O'Sullivan et al., "*The morphology and mechanism of formation of porous anodic films on aluminium*", Proc. Roy. Soc. Lond. A, vol. 317, pp. 511-543 (1970).

J.M. Park et al., "*Block Copolymer Lithography: Periodic Arrays of—10" Holes in 1 Square Centimeter*," Science vol. 276, pp. 1401-1404 (May 30, 1997).

M. Park et al., "*Novel Robust Cell Capacitor (Leaning Exterminated Ring Type Insulator) And New Storage Node Contact . . .* ", Symposium on VLSI Technology Digest of Technical Papers, pp. 34-35 (Jul. 2004).

Shingubara, "*Fabrication of nanomaterials using porous alumina templates*", J. Nanoparticle Res., vol. 5, pp. 17-30 (2003).

Tan et al., "*High Aspect Ratio Microstructures on Porous Anodic Aluminum Oxide*", IEEE, pp. 267-272 (1995).

Tsukada et al., "*Preparation and Application of Porous Silk Fibroin Materials*", 54 Journal of Applied Polymer Science, pp. 507-514 (1994).

U.S. Appl. No. 11/360,540, filed Feb. 2006, Rana et al.

U.S. Appl. No. 11/580,418, filed Oct. 2006, Raghu et al.

Li, X. and Bohn, P.W., "*Metal-assisted chemical etching in $HF/H_2O_2$ produces porous silicon*", Applied Physics Letters, vol. 77, No. 16, Oct. 16, 2000, pp. 2572-2574.

US04/0027696, Aug. 26, 2004, Written Opinion.

US06/06806, Mar. 30, 2007, IPER.

Yasaitis et al., "A modular process for integrating thick polysilicon MEMS devices with sub-micron CMOS", Pre-2004, Analog Devices, pp. 1-10.

US06/08606, Jan. 12, 2004, Search Report.

US06/06806, Aug. 26, 2004, Written Opinion.

US06/06806, Aug. 26, 2004, Response to Written Opinion.

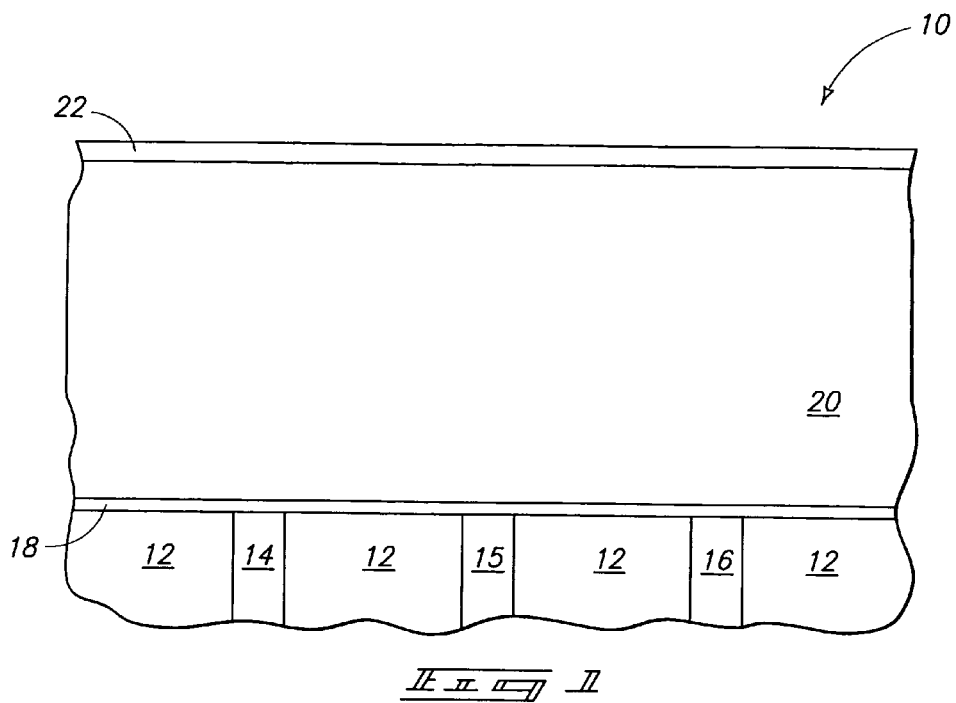
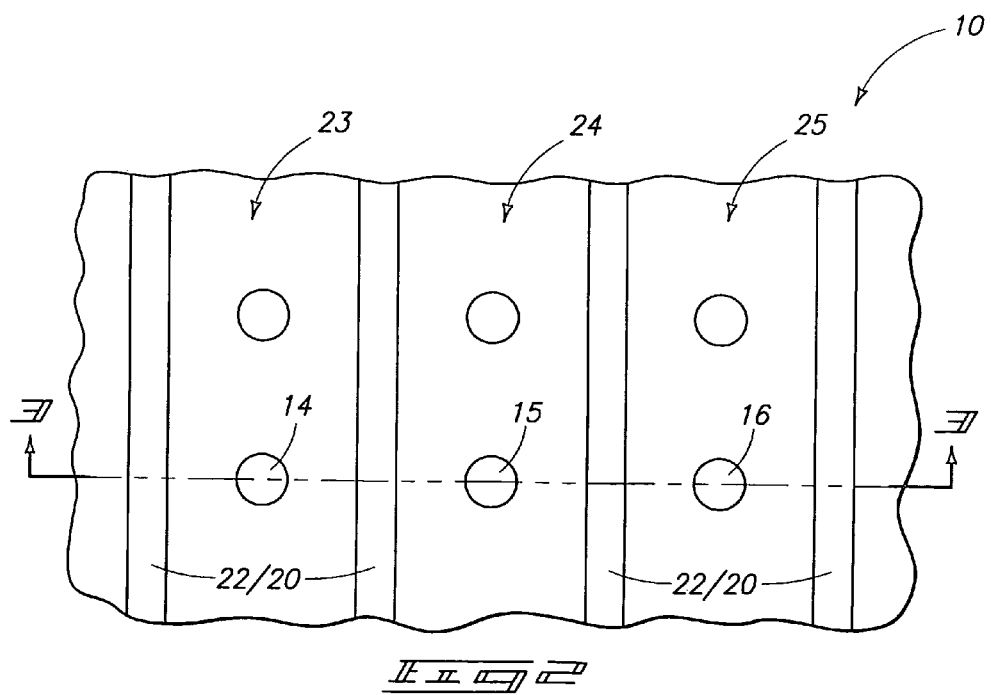

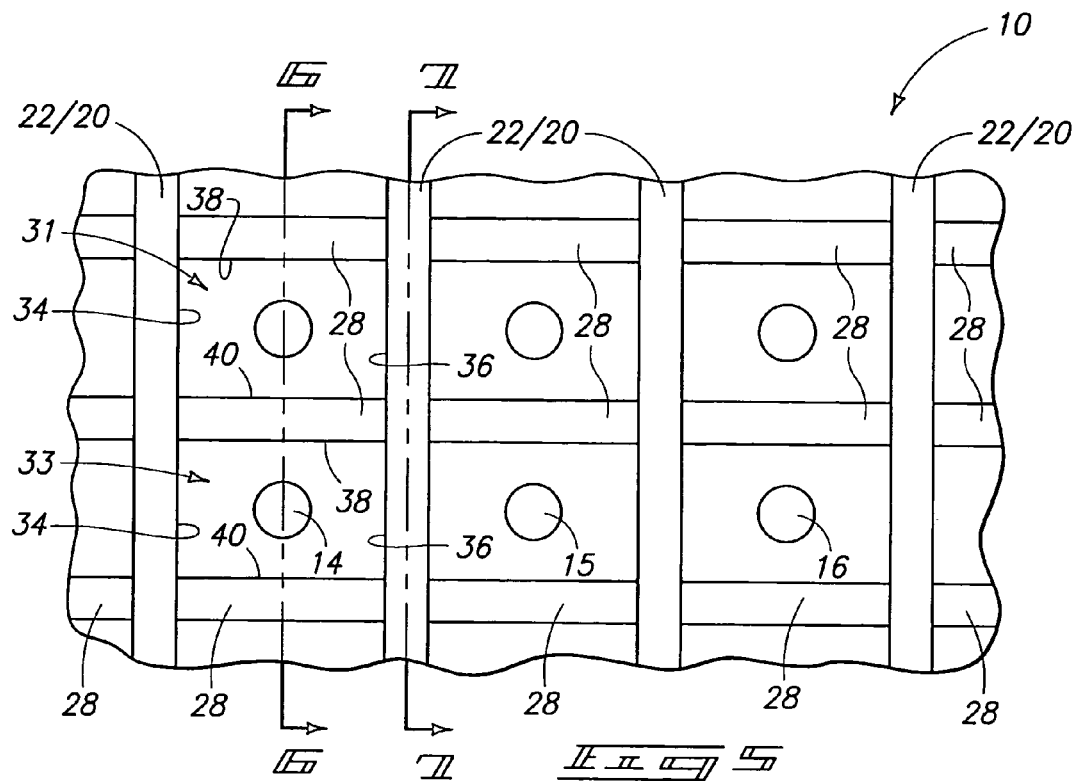
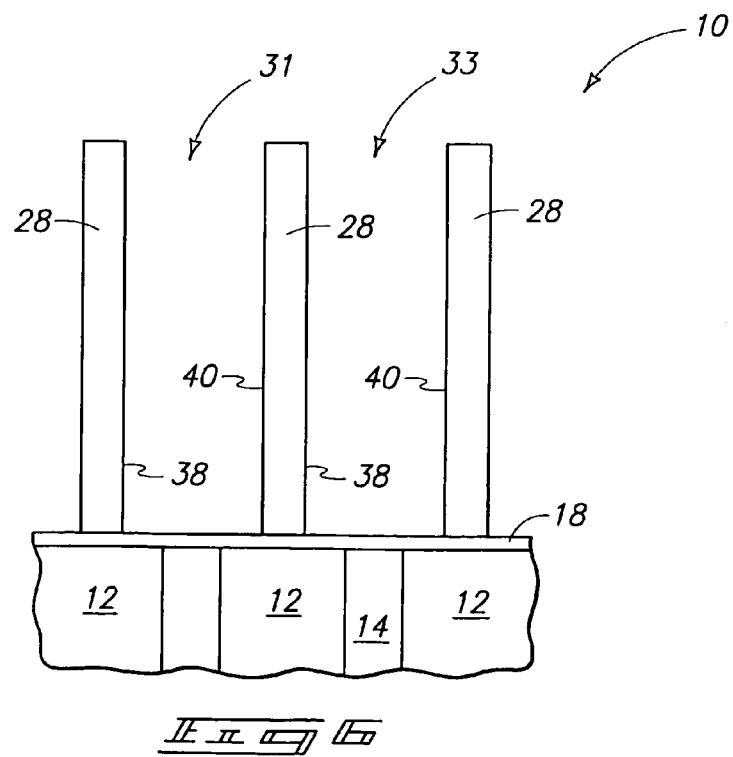

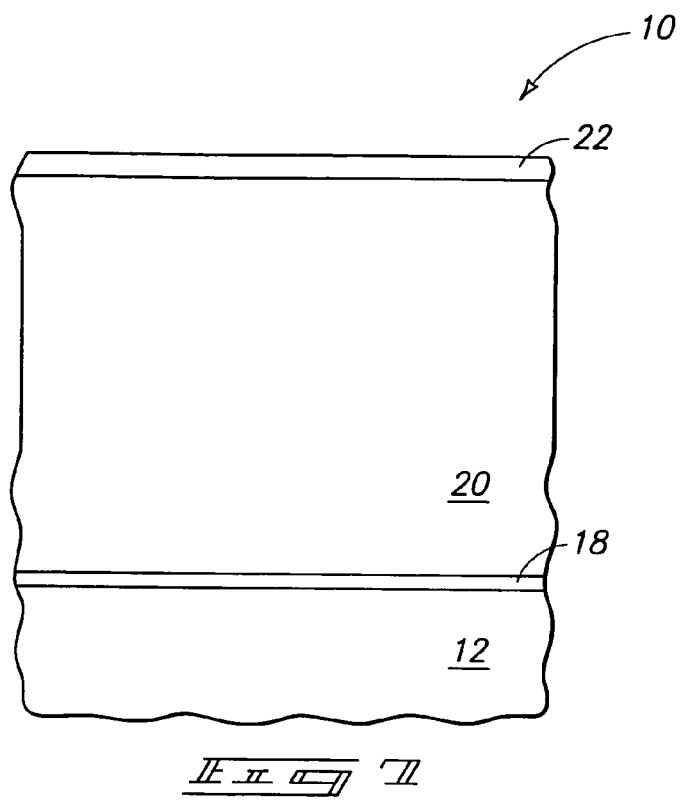
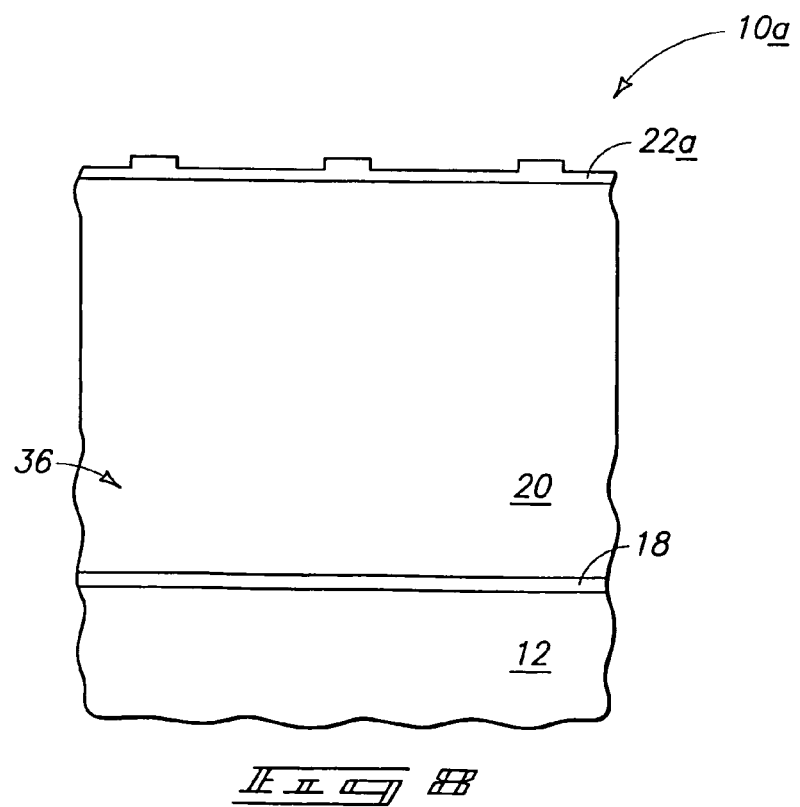

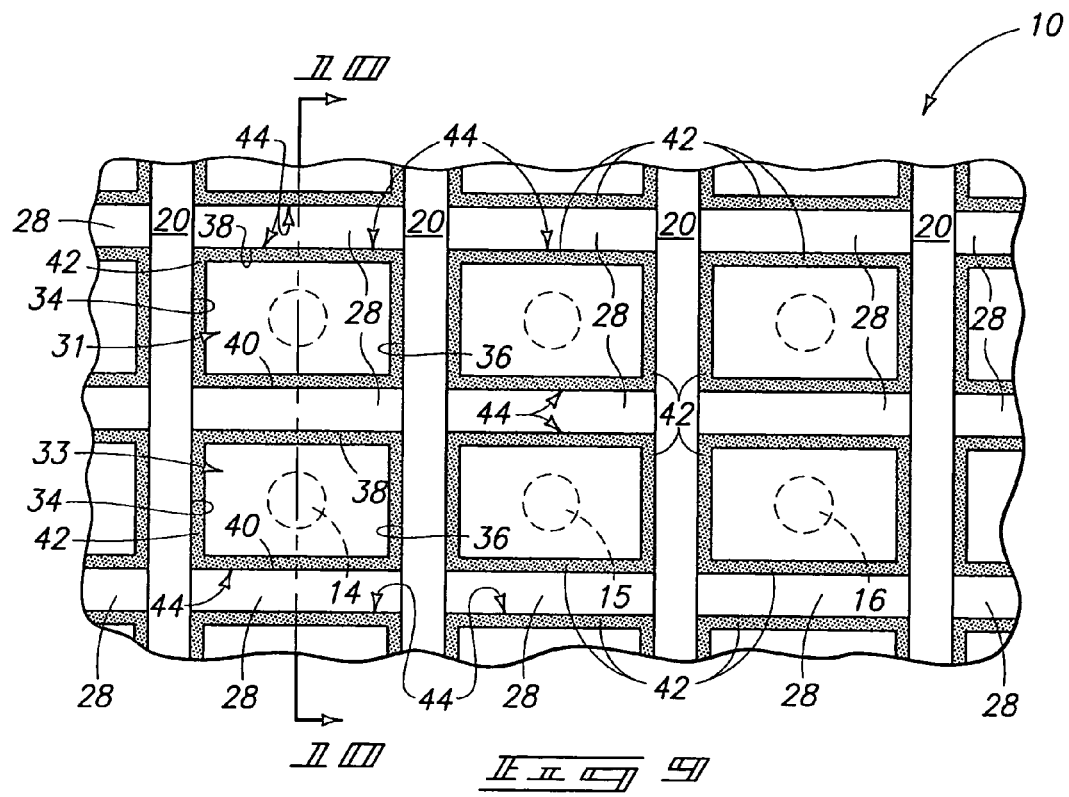
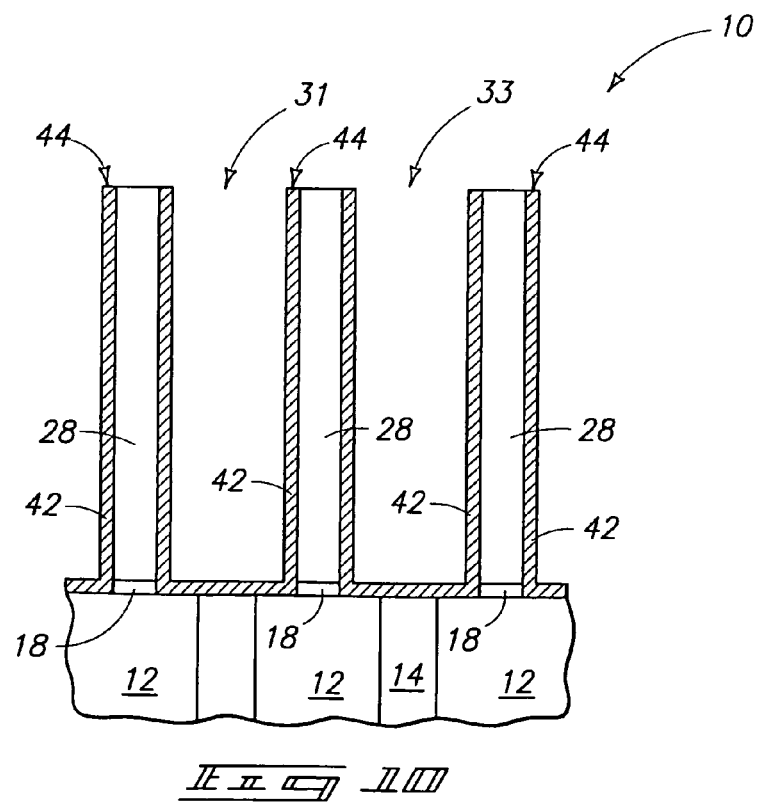

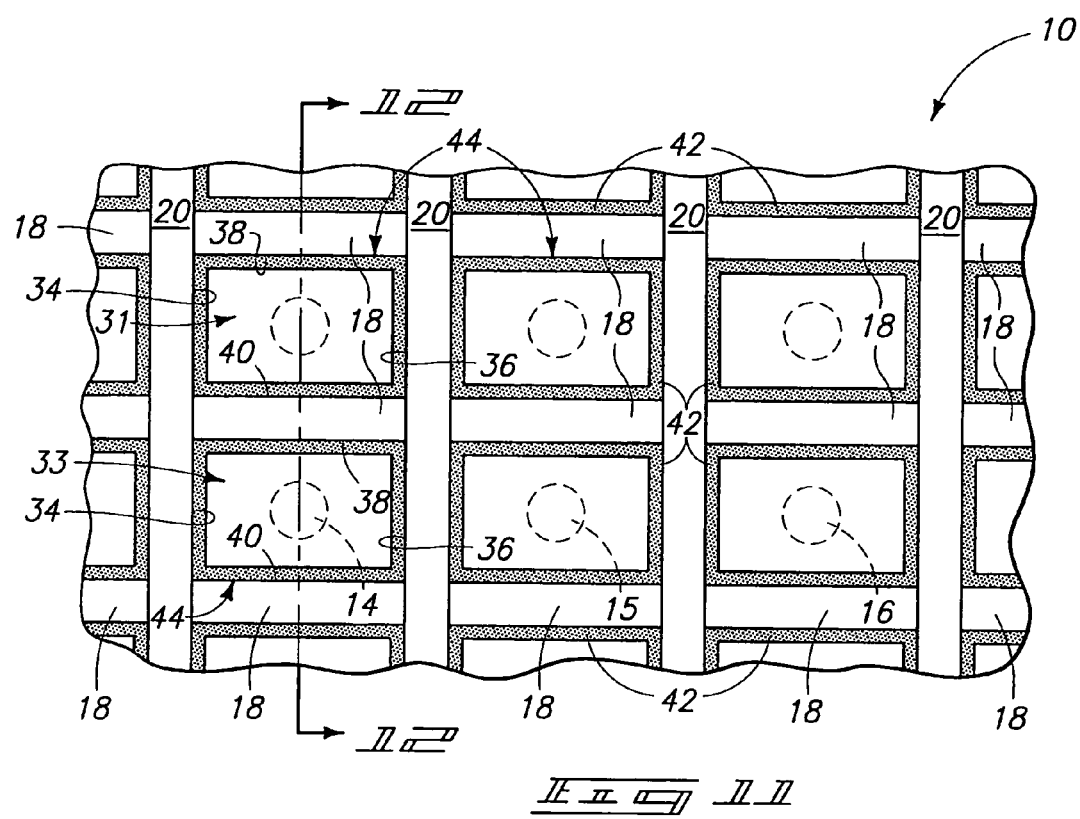
_FIG. 11_
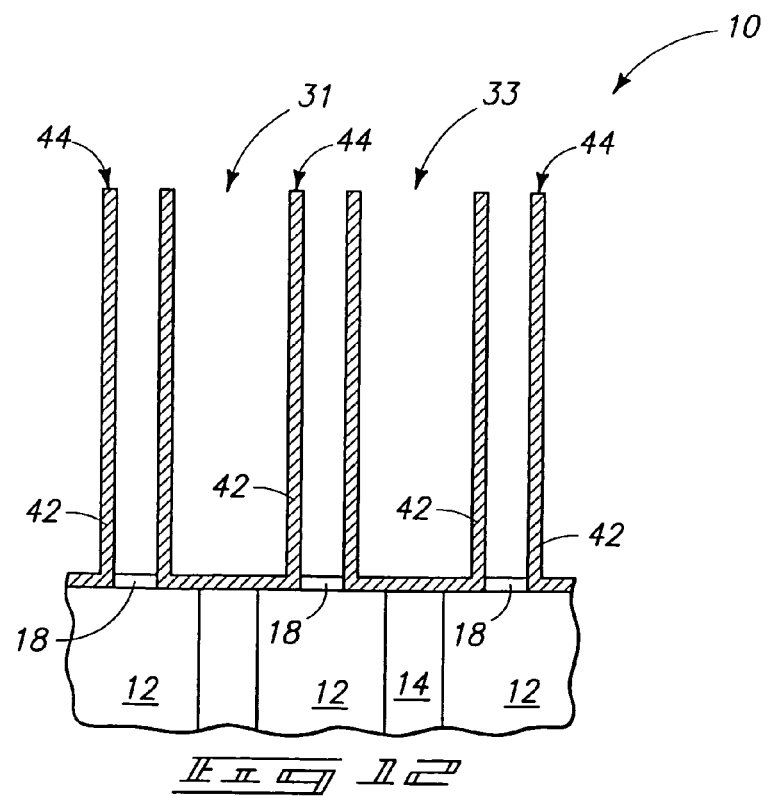
_FIG. 12_

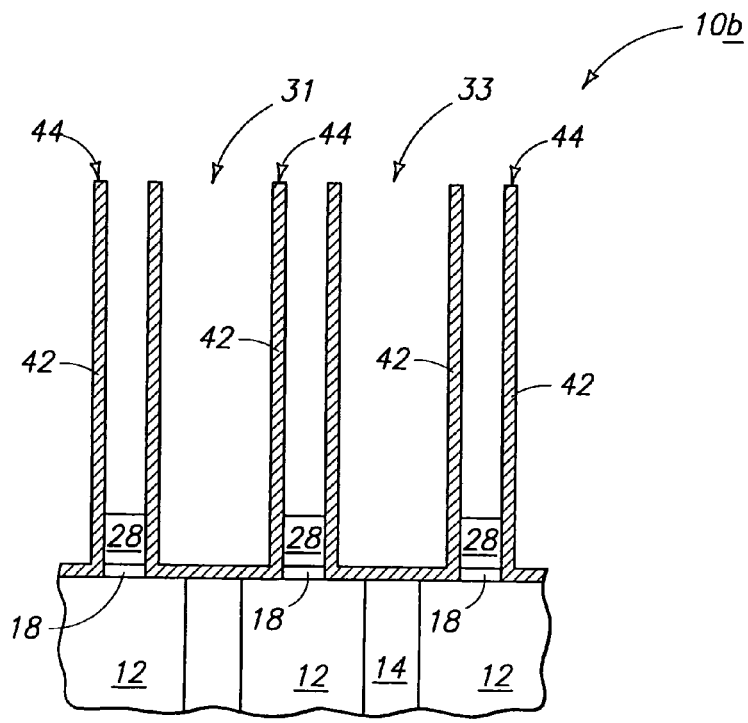
F I G. 13
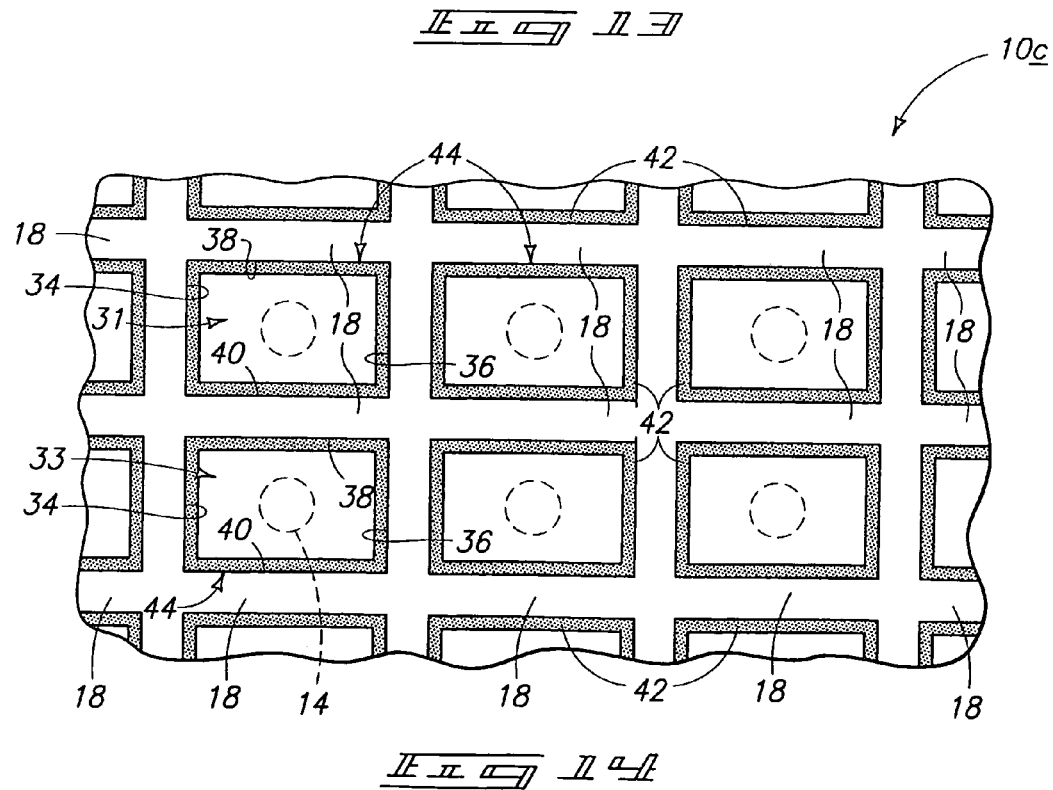
F I G. 14

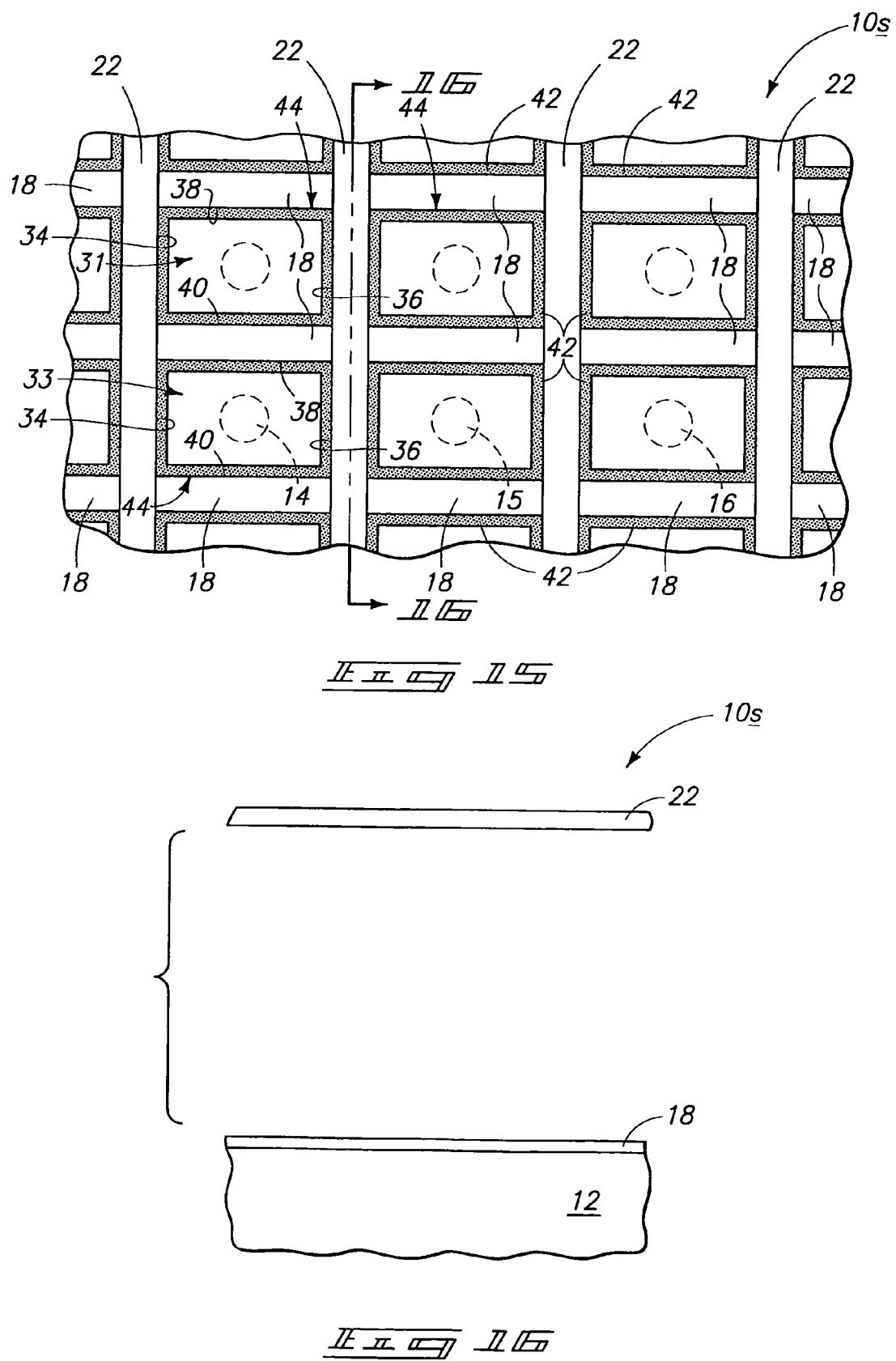

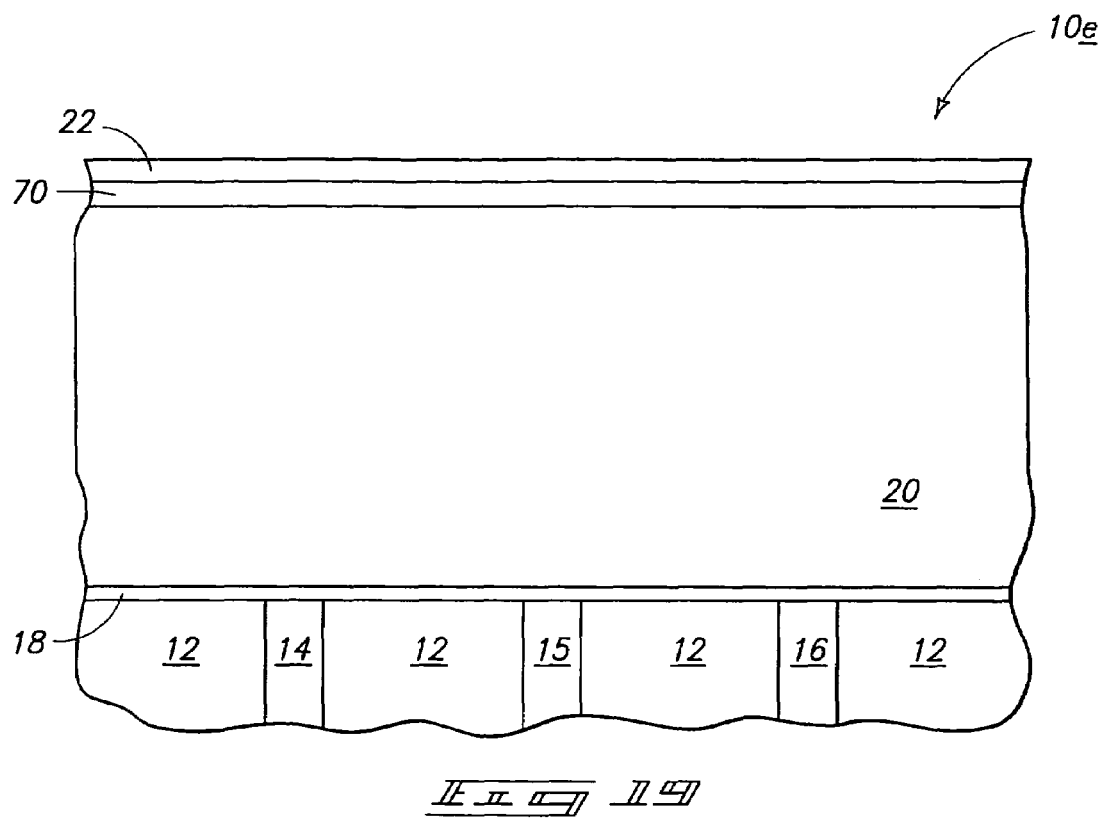
_Fig 19_
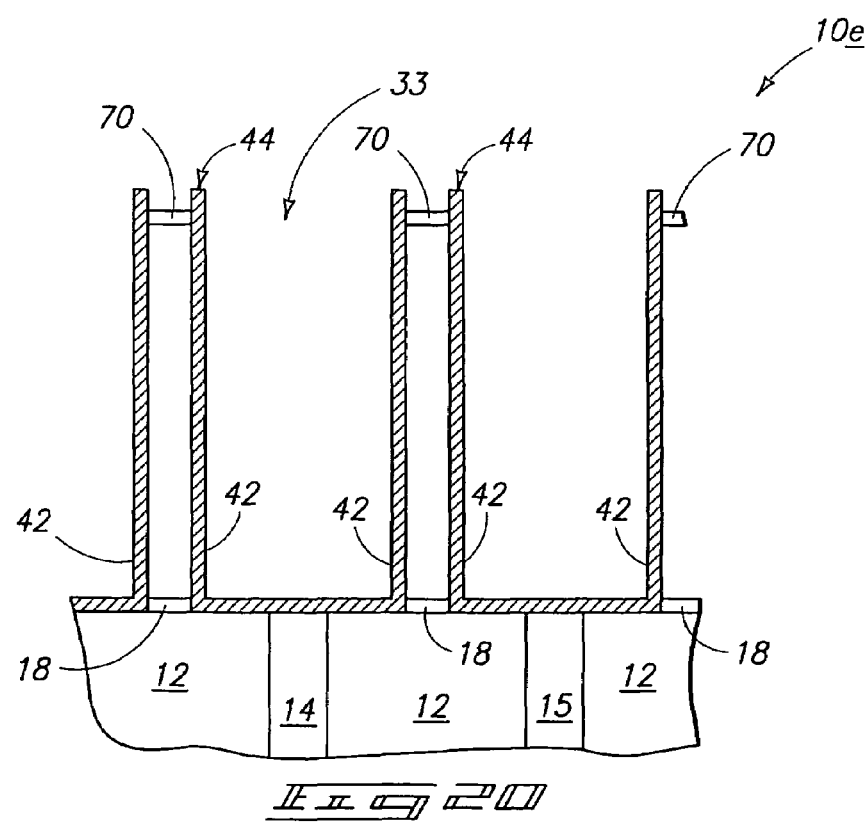
_Fig 20_

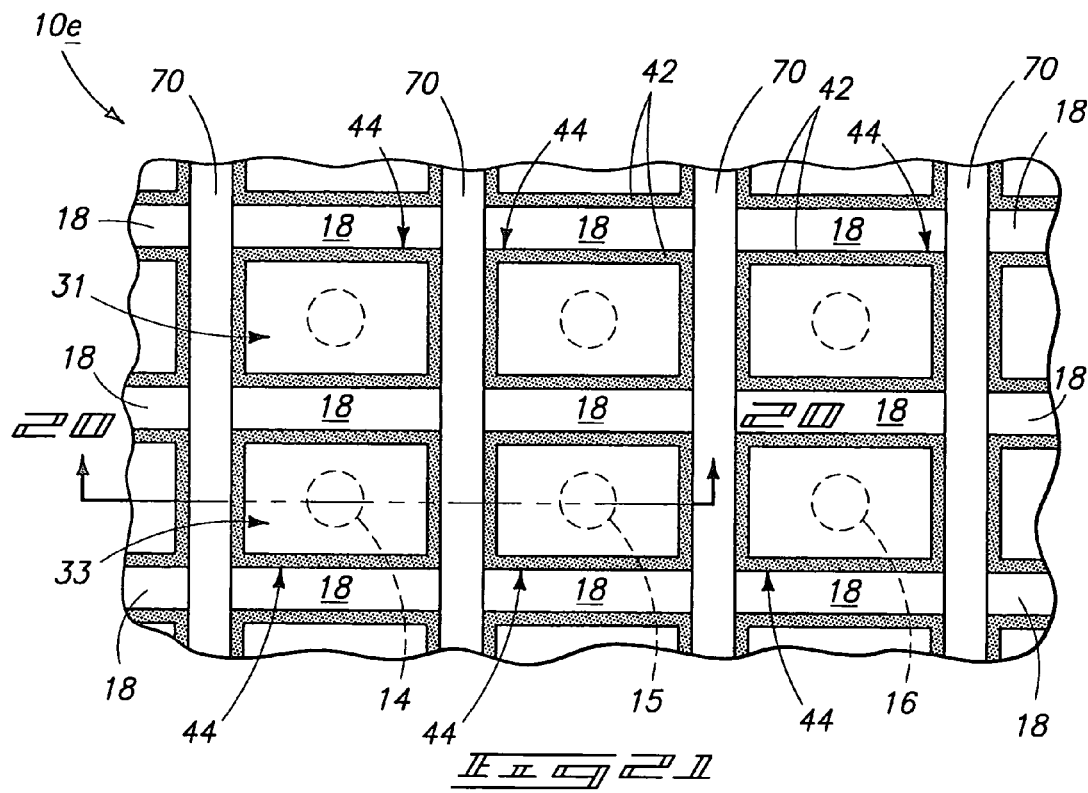
_FIG 21_
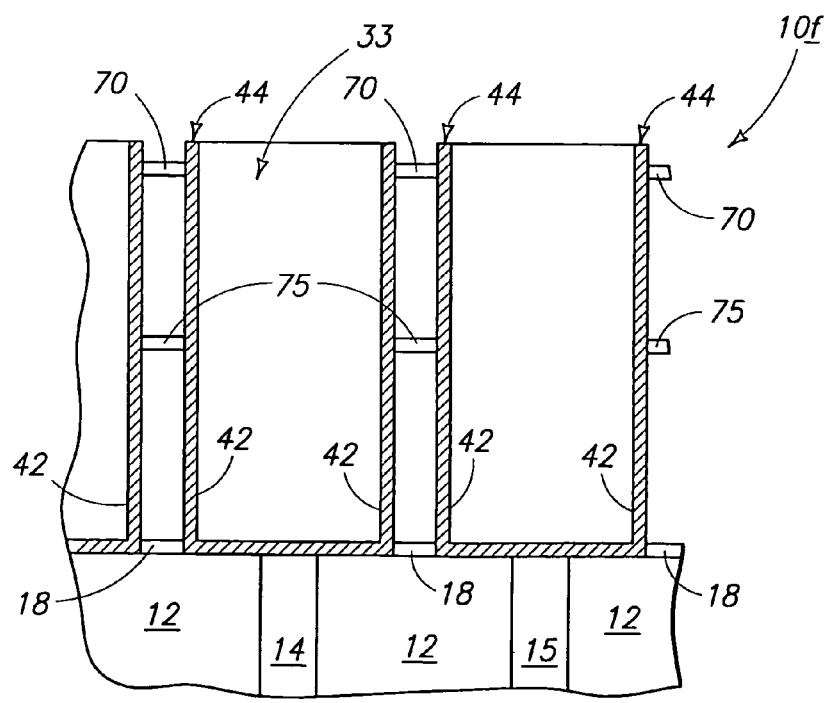
_FIG 22_

US 7,534,694 B2

METHODS OF FORMING A PLURALITY OF CAPACITORS

RELATED PARENT DATA

This patent resulted from a continuation application of U.S. patent application Ser. No. 10/929,037, filed Aug. 27, 2004, now U.S. Pat. No. 7,439,152 entitled "Methods of Forming a Plurality of Capacitors", naming H. Montgomery Manning as inventor, the disclosure of which is incorporated by reference.

TECHNICAL FIELD

This invention relates to methods of forming a plurality of capacitors.

BACKGROUND OF THE INVENTION

Capacitors are one type of component which is commonly used in the fabrication of integrated circuits, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared the vertical dimension. In some cases, the vertical dimension of capacitors has increased.

One manner of forming capacitors is to initially form an insulative material within which a capacitor storage node electrode is formed. For example, an array of capacitor electrode openings for individual capacitors is typically fabricated in such insulative capacitor electrode-forming material, with a typical insulative electrode-forming material being silicon dioxide doped with one or both of phosphorus and boron. The capacitor electrode openings are typically formed by etching. However, it can be difficult to etch the capacitor electrode openings within the insulative material, particularly where the openings are deep.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming a plurality of capacitors. In one implementation, a plurality of capacitor electrode openings is formed over a substrate. Individual of the capacitor electrode openings are bounded on a first pair of opposing sides by a first capacitor electrode-forming material at one elevation and on a second pair of opposing sides by a different second capacitor electrode-forming material at the one elevation. Individual capacitor electrodes are formed within individual of the capacitor electrode openings. The capacitor electrodes are incorporated into a plurality of capacitors.

In one implementation, a method of forming a plurality of capacitors comprises providing hardmask material over a different first capacitor electrode-forming material over a substrate. The hardmask material and first capacitor electrode-forming material are patterned into a plurality of trenches. A second capacitor electrode-forming material is provided within the trenches. The second capacitor electrode-forming material is selectively etchable relative to the first capacitor electrode-forming material and relative to the hardmask material. The second electrode-forming material is etched effective to form a plurality of capacitor electrode openings within the trenches. Individual of the capacitor electrode openings are bounded on a first pair of opposing sides by the first capacitor electrode-forming material at one elevation and on a second pair of opposing sides by the second capacitor electrode-forming material at the one elevation. Individual capacitor electrodes are formed within individual of the capacitor electrode openings and the capacitor electrodes are incorporated into a plurality of capacitors.

Other aspects and implementations are contemplated.

BRIEF DESCRIPTION OF THE DRAWINGS

Preferred embodiments of the invention are described below with reference to the following accompanying drawings.

FIG. 1 is a diagrammatic cross section of a substrate fragment in process in accordance with an aspect of the invention.

FIG. 2 is a diagrammatic top plan view of the FIG. 1 substrate at a processing step subsequent to that shown by FIG. 1.

FIG. 5 is a diagrammatic top plan view of the FIG. 4 substrate at a processing step subsequent to that shown by FIG. 4.

FIG. 6 is a view taken through line 6-6 in FIG. 5.

FIG. 7 is a view taken through line 7-7 in FIG. 5.

FIG. 8 is a view of an alternate substrate to that depicted by FIG. 7.

FIG. 9 is a top plan view of the FIG. 5 substrate at a processing step subsequent to that shown by FIG. 5.

FIG. 10 is a view taken through line 10-10 in FIG. 9.

FIG. 11 is a top plan view of the FIG. 9 substrate at a processing step subsequent to that shown by FIG. 9.

FIG. 12 is a view taken through line 12-12 in FIG. 11.

FIG. 13 is a view of an alternate embodiment substrate to that depicted by FIG. 12.

FIG. 14 is a view of an alternate embodiment substrate to that depicted by FIG. 11.

FIG. 15 is a view of an alternate embodiment substrate to that depicted by FIG. 11.

FIG. 16 is a view taken through line 16-16 in FIG. 15.

FIG. 19 is a diagrammatic cross section of another substrate fragment in process in accordance with an aspect of the invention.

FIG. 20 is a view of the FIG. 19 substrate at a processing step subsequent to that depicted by FIG. 19.

FIG. 21 is a diagrammatic-top plan view of the FIG. 20 substrate.

FIG. 22 is a diagrammatic cross section of yet another embodiment substrate fragment in process in accordance with an aspect of the invention.

DETAILED DESCRIPTION OF THE PREFERRED EMBODIMENTS

Figure 3:
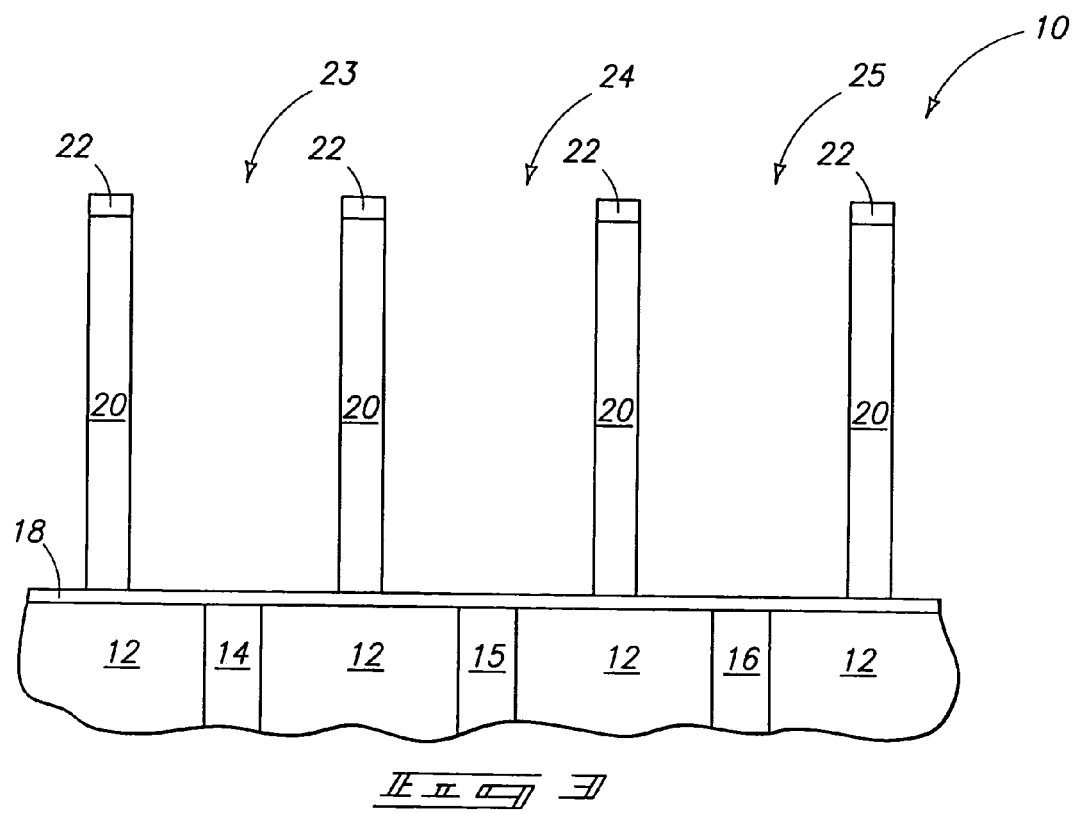
FIG. 3 is a view taken through line 3-3 in FIG. 2.

This disclosure of the invention is submitted in furtherance of the constitutional purposes of the U.S. Patent Laws "to promote the progress of science and useful arts" (Article 1, Section 8).

Preferred embodiment methods of forming a plurality of capacitors in multiple embodiments are described with reference to FIGS. 1-22. Referring initially to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural, unless otherwise indicated. By way of example only, substrate fragment 10 is depicted as comprising an insulative layer 12 having a plurality of conductive contact plugs 14, 15 and 16 formed therein for electrical connection with respect to capacitor electrodes of a plurality of capacitors, as will be apparent from the continuing discussion. Insulative material 12 would overlie other substrate material (not shown), for example bulk monocrystalline silicon, semiconductor-on-insulator circuitry or other substrate material whether existing or yet-to-be developed. Exemplary preferred insulative material 12 includes borophosphosilicate glass (BPSG). Conductive plugs 14, 15 and 16 will comprise one or more conductive materials, including for example conductively doped semiconductive material. Substrate 12/14/15/16 is exemplary only, and any conceivable substrate is contemplated whether existing or yet-to-be developed.

A preferred etch stop layer 18 is formed over substrate 12/14/15/16. A preferred thickness range for layer 18 is from 20 Angstroms to 2,000 Angstroms, with hafnium oxide, aluminum oxide, silicon carbide and/or silicon nitride being exemplary preferred materials. In the depicted exemplary embodiment, preferred etch stop layer 18 has been provided after the formation of the openings within which conductive plugs 14, 15 and 16 have been formed. Alternately by way of example only, materials 12 and 18 could be initially fabricated, followed by the formation of the openings in materials 12 and 18 followed by provision of the conductive material forming plugs 14, 15 and 16.

A first capacitor electrode-forming material 20 has been formed over substrate 12/14/15/16/18. Material 20 might be conductive or insulative, with an insulative material being preferred. A preferred example material is doped silicon dioxide, for example BPSG. An exemplary preferred thickness range for material 20 is from 5,000 Angstroms to 40,000 Angstroms. A preferred hardmask material 22 is formed over first capacitor electrode-forming material 20, with hardmask material 22 being of different composition than first capacitor electrode-forming material 20. An exemplary thickness range for hardmask material 22 is from 20 Angstroms to 5,000 Angstroms. Exemplary preferred materials include one or various combinations of silicon oxynitride, silicon carbide, silicon carbon nitride, silicon nitride, polysilicon, titanium nitride, amorphous carbon and transparent carbon. Aspects of the invention might be practiced without fabrication of etch stop layer 18 and hardmask 22, although provision of such is more preferred.

Referring to FIGS. 2 and 3, hardmask material 22 and first capacitor electrode-forming material 20 have been patterned into a plurality of trenches 23, 24 and 25. A preferred method of conducting the same comprises photolithography and etch. In one preferred embodiment and as shown, first capacitor electrode-forming material 20 is etched completely to etch stop layer 18, and preferably selectively relative thereto. Alternately by way of example only, etching of material 20 might not occur all the way to etch stop layer 18 where such layer is present. An exemplary preferred etching chemistry for etching a BPSG material 20 selectively relative to a silicon nitride etch stop material 18 includes $C_4F_6$, Ar, and $O_2$ in a volumetric ratio of 4:40:3, at 30 mTorr and 2000 W. In the depicted and preferred embodiment, trenches 23, 24 and 25 are oriented generally parallel to one another. A preferred pitch in the fabrication of trenches 23, 24 and 25 is 3F, where "F" is the minimum reticle pitch utilized in the fabrication of the integrated circuitry of which the capacitors in fabrication comprise a part.

Figure 4:
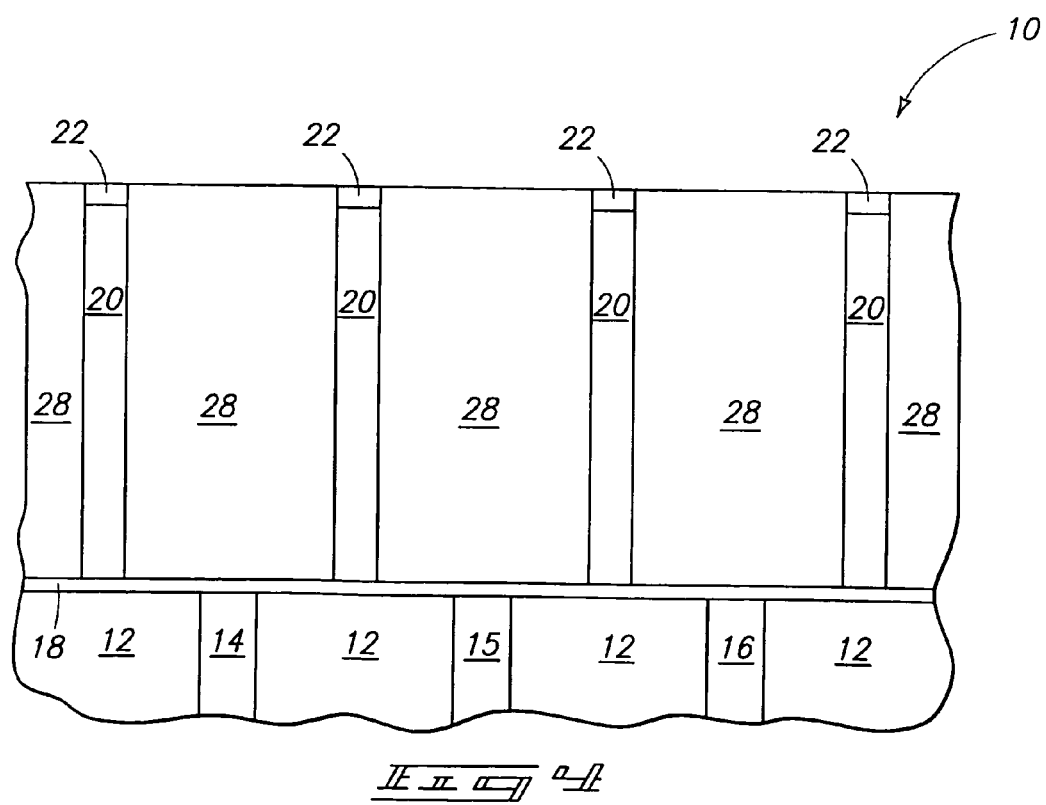
FIG. 4 is a view of the FIG. 3 substrate at a processing step subsequent to that shown by FIG. 3.

Referring to FIG. 4, a second capacitor electrode-forming material 28 has been provided within trenches 23, 24 and 25. A preferred method of forming material 28 is by deposition followed by planarize polishing (for example chemical-mechanical polishing) of the deposited material to proximate the outer surface of hardmask material 22. Second capacitor electrode-forming material 28 is ideally selected to be selectively etchable relative to first capacitor electrode-forming material 20 and relative to hardmask material 22. Second capacitor electrode-forming material 28 might be insulative, conductive or semiconductive (and independent of whether semiconductive material is conductively doped). A preferred exemplary material 28 comprises doped or undoped polysilicon, for example where first capacitor electrode-forming material 20 comprises BPSG.

Referring to FIGS. 5-7, second capacitor electrode-forming material 28 has been etched effective to form a plurality of capacitor electrode openings within the previously formed trenches 23, 24 and 25, with two such exemplary capacitor electrode openings being indicated with numerals 31 and 33. In the depicted FIGS. 5-7 embodiment, such etching of second electrode-forming material 28 has been conducted to etch stop layer 18, and selectively relative thereto. By way of example only where material 18 comprises silicon nitride, first capacitor electrode-forming material 20 comprises BPSG, and second capacitor electrode-forming material 28 comprises doped or undoped polysilicon, an exemplary dry anisotropic etching chemistry for material 28 includes one that is fluorine and $O_2$ based, for example $SF_6$, HBr and $O_2$ in a 5:4:3 volumetric ratio. Some of hardmask material 22 might also be etched into, for example as shown in FIG. 8 with respect to an alternate example substrate fragment 10a as compared to that of FIG. 7. Like numerals from the first described embodiment are utilized where appropriate, with differences being indicated with the suffix "a".

Referring to FIGS. 5-7, individual of capacitor electrode openings 31 and 33 can be considered as comprising a first pair of opposing sides 34 and 36 and a second pair of opposing sides 38 and 40. Accordingly, individual capacitor electrode openings 31 and 33 are bounded on a first pair of opposing sides 34 and 36 by first capacitor electrode-forming material 20 at one elevation, and on a second pair of opposing sides 38, 40 by second capacitor electrode-forming material 28 at the one elevation. In the context of this document, an "elevation" defines a point or horizontal line location anywhere along a generally vertically oriented thickness of the substrate, for example any point or line location along the thickness of materials 20 and 28. In one exemplary embodiment, the pitch between adjacent regions of material 28 after the patterning is 2F. Of course, the 2F and 3F dimensions could be reversed, as well as other dimensions as a function of F (for example between 2F and 8F in each dimension), or otherwise, could also be utilized. In the depicted preferred embodiment, the first and second pairs of opposing sides intersect one another at an angle of about 90°, with exemplary preferred 90° intersecting being shown relative to side 38 with side 36, 36 with 40, 40 with 38, and 34 with 38.

Referring to FIGS. 9 and 10, conductive capacitor electrode material 42 has been deposited and formed into individual capacitor electrodes 44 within individual of capacitor electrode openings 31 and 33, and for example within the other individual capacitor electrode openings not depicted with numerals. By way of example only, an exemplary preferred material 42 comprises titanium nitride. One preferred manner of forming the FIGS. 9 and 10 construction is by deposition of material 42 followed by planarized polishing thereof, for example by chemical-mechanical polishing. Such polishing might be conducted effective to either stop upon or at least leave some of hardmask material 22 on the substrate, as would be preferred and as is further described below. Alternately as shown, such polishing might be conducted effective to remove all remaining of hardmask material 22 from the substrate. At least some of etch stop material 18 (if used) would be removed from within the capacitor electrode openings prior to formation of capacitor electrodes 44 to expose the contact material (i.e., contact material 14) if etch stop material 18 was not deposited and patterned prior to forming the openings within which the contact material is received.

Capacitor electrodes 44 are ultimately incorporated into a plurality of capacitors. For example in one preferred implementation, at least some of at least one of the first and second capacitor electrode-forming materials is removed to expose opposing outer lateral sidewall surface portions of capacitor electrodes 44. The preferred removing techniques are by chemical etching, whether using existing or yet-to-be developed methods. Regardless, one exemplary embodiment is depicted with reference to FIGS. 11 and 12. By way of example only, such depicts the removal of all of only one of the first and second capacitor electrode-forming materials, with removal of all of material 28 being depicted (with material 28 thereby not being shown in FIGS. 11 and 12).

An aspect of the invention also contemplates removing only some of at least one of the first and second capacitor electrode-forming materials including, by way of example only, removing only some of only one of the first and second capacitor electrode-forming materials. For example, FIG. 13 depicts an alternate embodiment substrate fragment 10b wherein some material 28 is left remaining intermediate adjacent individual capacitor electrodes 44. Like numerals from the first described embodiments are utilized where appropriate, with differences being indicated by the suffix "b", or with different numerals. In such embodiment, material 28 should comprise an insulative material to preclude shorting of adjacent electrodes 44.

Further by way of example only, FIG. 14 depicts an alternate embodiment substrate fragment 10c wherein all of first capacitor electrode-forming material 20 and all of second capacitor electrode-forming material 28 have been removed from the substrate. Like numerals from the first described embodiments are utilized where appropriate, with differences being indicated by the suffix "c", or with different numerals.

Still further by way of example only, FIGS. 15 and 16 depict an alternate embodiment substrate fragment 10s wherein some of hardmask material 22 remains at the conclusion of polishing material 42. Like numerals from the first described embodiments are utilized where appropriate, with differences being indicated by the suffix "s". Here in the depicted FIGS. 15 and 16 embodiment, all of first capacitor electrode-forming material 20 and all of second capacitor electrode-forming material 28 have been removed from the substrate, yet while at least some of hardmask material 22 remains. Accordingly in such embodiment, hardmask material 22 might remain to constitute a portion of the finished circuitry construction. Alternately, such might be subsequently entirely removed.

Figure 17:
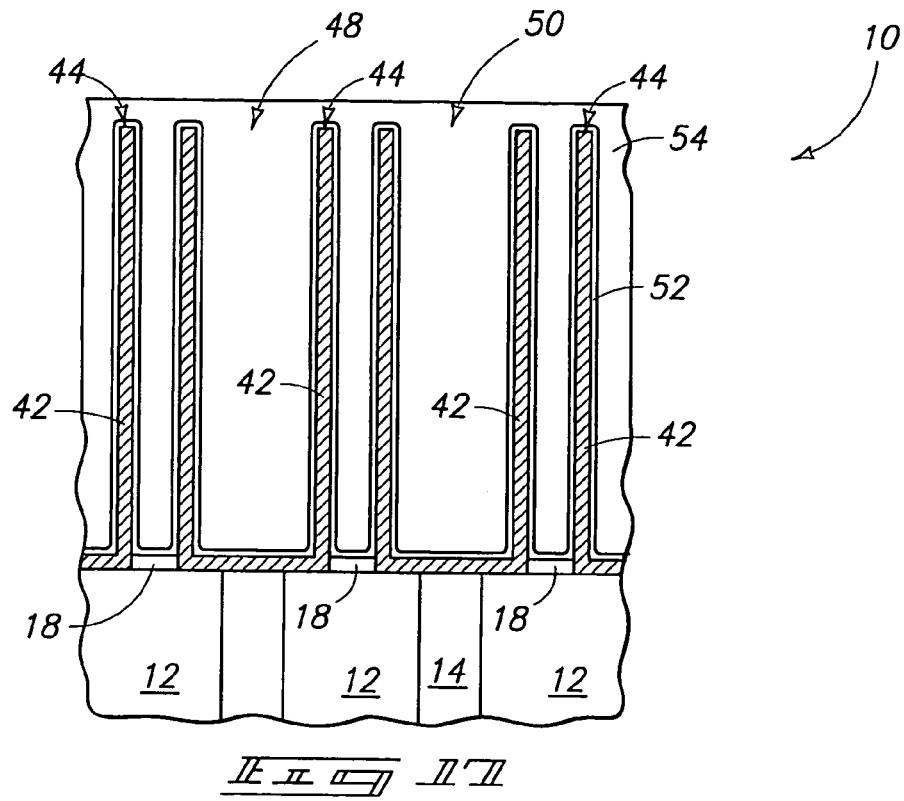
FIG. 17 is a view of the FIG. 12 substrate at a processing step subsequent to that depicted by FIG. 12.

By way of example only, FIG. 17 depicts subsequent processing having been conducted relative to substrate fragment 10 to incorporate capacitor electrodes 44 into a plurality of capacitors, with two of such capacitors being indicated with numerals 48 and 50. In the depicted preferred exemplary embodiment, capacitor dielectric material 52 has been deposited over capacitor electrodes 44, and a second or outer capacitor electrode 54 formed thereover. In the exemplary embodiment, capacitor electrode 54 is common to all of the capacitors, for example as might be utilized in the fabrication of DRAM circuitry. However of course, the fabrication of individual or smaller grouped second capacitor electrodes is also contemplated. Any suitable existing or yet-to-be developed materials can be used for materials 52 and 44, and material 44 might be the same or different from material 42.

Figure 18:
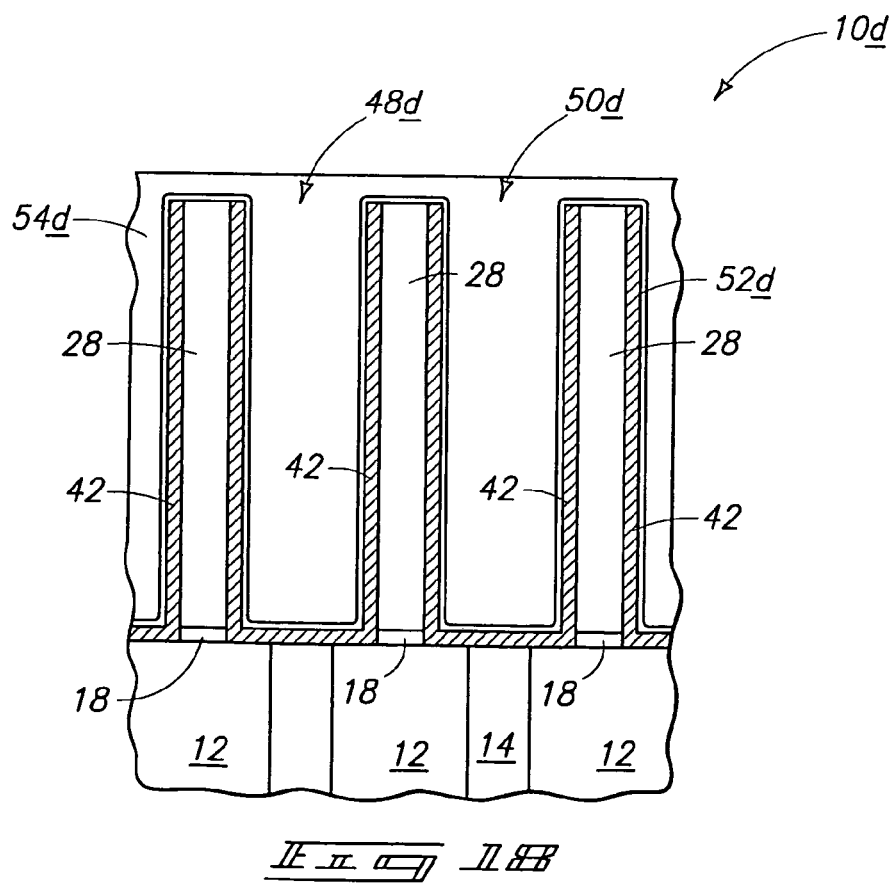
FIG. 18 is a view of an alternate embodiment substrate to that depicted by FIG. 17.

Further by way of example only, FIG. 18 depicts an alternate embodiment substrate fragment 10d wherein none of capacitor-forming material 28 has been removed from between adjacent capacitor electrodes 44. Like numerals from the first described embodiments are utilized where appropriate, with differences being indicated by the suffix "d", or with different numerals. In such embodiment, material 28 should comprise an insulative material to preclude shorting of adjacent electrodes 44.

An aspect of the invention contemplates individual capacitor electrodes being supported, at least in part, by at least one of the first and second capacitor electrode-forming materials in a finished circuitry construction incorporating the plurality of capacitors. For example and by way of example only, at least the FIGS. 17, 18 and 13 embodiments contemplate at least one of the first and second capacitor electrode-forming materials remaining as part of the finished circuitry construction, which thereby at least in part provides some structural support to the individual capacitor electrodes. By way of example only, the exemplary FIGS. 18 and 13 embodiments depict or contemplate the individual capacitor electrodes being supported, at least in part, by both of the first and second capacitor electrode-forming materials in the finished circuitry construction, as some of both such materials remains in such construction in such embodiments. Further by way of example only, the FIG. 17 embodiment depicts individual capacitor electrodes being supported, at least in part, by only one of the first and second capacitor electrode-forming materials in the finished circuitry construction, namely first capacitor electrode-forming material 20 essentially as depicted by FIG. 11.

However, the invention also contemplates embodiments wherein the individual capacitor electrodes are not supported by any of the first and second capacitor electrode-forming materials in the finished circuitry construction, for example as is intended to be depicted with respect to the FIG. 14 embodiment. Most preferred is at least some exposure of outer sidewall surfaces of the depicted preferred embodiment capacitor electrodes for reasons of maximizing the capacitance of the capacitors formed therefrom. Some support thereof is also preferred, at least until the fabrication of the capacitor dielectric material and outer capacitor electrode, to preclude individual electrodes from toppling into one another or being dislodged from the substrate.

In one aspect, the invention contemplates providing a retaining structure at another elevation (in comparison to the one elevation referred to above) in physical contact with a plurality of the individual electrodes, for example where the retaining structure comprises material different from both of the first and second capacitor electrode-forming materials. Exemplary preferred retaining structures, materials, purposes and circuitry are as disclosed in our co-pending U.S. patent application Ser. No. 10/733,181, filed Dec. 10, 2003, entitled "Semiconductor Constructions, and Methods of Forming Capacitor Devices", naming H. Montgomery Manning, Thomas M. Graettinger and Marsela Pontoh as inventors, and which is now U.S. Pat. No. 7,125,781; and our co-pending U.S. patent application Ser. No. 10/894,633 filed on Jul. 19, 2004, entitled "Methods of Forming Semiconductor Structures and Capacitor Devices" naming H. Montgomery Manning as inventor, and which is now U.S. Patent Publication No. 2006-0014344, both disclosures of which are fully incorporated herein by reference as if presented in their entirety herein.

For example and by way of example only, an exemplary incorporation of a retaining structure is herein described with reference to a substrate fragment 10e in FIGS. 19-21 Like numerals from the first described embodiment are utilized where appropriate, with differences being indicated with the suffix "e", or with different numerals. FIG. 19 depicts wafer fragment 10e as comprising a material or layer 70 received intermediate substrate 12/14/15/16/18 and hardmask material 22. Processing would otherwise occur as described above starting at FIG. 2 and, for example, wherein some, all or none of the first capacitor electrode-forming material and/or the second capacitor electrode-forming material is removed from the substrate. For example, FIGS. 20 and 21 depict one embodiment substrate fragment 10e corresponding in process sequence to that depicted by FIG. 12 wherein all of second capacitor electrode-forming material 28 has been removed, all of first capacitor electrode-forming material 20 has been removed, and yet here where a retaining structure formed of material 70 remains, in one example as a lattice. Further alternately or in addition thereto, and by way of example only, a retaining structure could be formed from material 22 for example essentially as is shown in FIGS. 15 and 16.

In the preferred and just-described embodiment, retaining structure 70 is provided prior to forming capacitor electrodes 44 within capacitor electrode openings 31 and 33, and even prior to forming capacitor electrode openings 31 and 33. Any alternative thereto is also of course contemplated. In one preferred embodiment, the retaining structure is electrically insulative and comprises a part of a finished circuitry construction incorporating the plurality of capacitors. Alternately, and independent of whether the retaining structure is insulative, no portion of the retaining structure might remain to comprise a part of the finished circuitry construction incorporating the plurality of capacitors. Further, the retaining structure 70 as depicted might be provided elevationally lower relative to the capacitor electrodes. For example with respect to FIG. 19, layer 70 might be provided displaced from hardmask material 22, and (or even if such is not utilized) elevationally lower within material 20 such that material 20 (or some other material) is received both above and below layer 70 (not shown).

Further by way of example only, the invention contemplates providing a plurality of the retaining structures at different elevations from the one elevation, for example as depicted with respect to a wafer fragment 10f in FIG. 22. Like numerals from the FIGS. 19-21 embodiment are utilized where appropriate, with differences being indicated by the suffix "f", or with different numerals. FIG. 22 depicts another retaining structure 75 provided elevationally below retaining structure 70, by way of example only. Of course, such might remain to constitute a part of a finished circuitry construction, or be removed therefrom prior to conclusion of the circuitry fabrication. Further and regardless, additional such retaining structures might be provided.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended-claims appropriately interpreted in accordance with the doctrine of equivalents.

The invention claimed is:

1. A method of forming a plurality of capacitors, comprising:
    forming a plurality of capacitor electrode openings over a semiconductor substrate, individual of the capacitor electrode openings being bounded on a first pair of opposing sides by a first capacitor electrode-forming material at one elevation and on a second pair of opposing sides by a different second capacitor electrode-forming material at the one elevation, the first and second capacitor electrode-forming materials comprising respective thicknesses which overlap one another across the one elevation, one of the first and second capacitor electrode-forming materials being insulative and the other of the first and second capacitor electrode-forming materials being conductive;
    forming individual capacitor electrodes within individual of the capacitor electrode openings; and
    incorporating the capacitor electrodes into a plurality of capacitors.

2. The method of claim 1 wherein the individual capacitor electrodes are supported at least in part by at least one of the first and second capacitor electrode-forming materials in a finished circuitry construction incorporating the plurality of capacitors.

3. The method of claim 2 wherein the individual capacitor electrodes are supported at least in part by only one of the first and second capacitor electrode-forming materials in the finished circuitry construction.

4. The method of claim 2 wherein the individual capacitor electrodes are supported at least in part by both of the first and second capacitor electrode-forming materials in the finished circuitry construction.

5. The method of claim 1 wherein the individual capacitor electrodes are not supported by any of the first and second capacitor electrode-forming materials in a finished circuitry construction incorporating the plurality of capacitors.

6. A method of forming a plurality of capacitors, comprising:
    forming a plurality of capacitor electrode openings over a semiconductor substrate, individual of the capacitor electrode openings being bounded on a first pair of opposing sides by a first capacitor electrode-forming material at one elevation and on a second pair of opposing sides by a different second capacitor electrode-forming material at the one elevation, the first and second capacitor electrode-forming materials comprising respective thicknesses which overlap one another across the one elevation;

forming individual capacitor electrodes within individual of the capacitor electrode openings;

providing a retaining structure at another elevation supportive of a plurality of the individual capacitor electrodes, the retaining structure comprising material different from both of the first and second capacitor electrode-forming materials; and incorporating the capacitor electrodes into a plurality of capacitors.

7. The method of claim 6 wherein the retaining structure is provided prior to forming the capacitor electrodes within the capacitor electrode openings.

8. The method of claim 7 wherein the retaining structure is provided prior to forming the plurality of capacitor electrode openings.

9. The method of claim 6 comprising providing a plurality of the retaining structures at different elevations from the one elevation.

10. The method of claim 6 wherein the retaining structure is insulative and comprises a part of a finished circuitry construction incorporating the plurality of capacitors.

11. The method of claim 6 wherein no portion of the retaining structure comprises a part of a finished circuitry construction incorporating the plurality of capacitors.

12. The method of claim 6 wherein the retaining structure comprises a lattice.

13. A method of forming a plurality of capacitors, comprising:

forming a plurality of capacitor electrode openings over a semiconductor substrate, individual of the capacitor electrode openings being bounded on a first pair of opposing sides by a first capacitor electrode-forming material at one elevation and on a second pair of opposing sides by a different second capacitor electrode-forming material at the one elevation;

forming individual capacitor electrodes within individual of the capacitor electrode openings;

providing a retaining structure comprising a lattice at another elevation supportive of a plurality of the individual capacitor electrodes, the retaining structure comprising material different from both of the first and second capacitor electrode-forming materials, wherein cross pieces of the lattice intersect one another at about 90°; and incorporating the capacitor electrodes into a plurality of capacitors.

14. A method of forming a plurality of capacitors, comprising:

forming a plurality of capacitor electrode openings over a semiconductor substrate, individual of the capacitor electrode openings being bounded on a first pair of opposing sides by a first capacitor electrode-forming material at one elevation and on a second pair of opposing sides by a different second capacitor electrode-forming material at the one elevation, the first and second capacitor electrode-forming materials comprising respective thicknesses which overlap one another across the one elevation;

forming individual capacitor electrodes within individual of the capacitor electrode openings;

providing a retaining structure at another elevation supportive of a plurality of the individual capacitor electrodes, the retaining structure comprising material different from both of the first and second capacitor electrode-forming materials;

after forming the capacitor electrodes, removing at least some of at least one of the first and second capacitor electrode-forming materials to expose opposing outer lateral sidewall surface portions of the capacitor electrodes; and incorporating the capacitor electrodes into a plurality of capacitors.

15. The method of claim 14 wherein the removing is of all of at least one of the first and second capacitor electrode-forming materials.

16. The method of claim 15 wherein the removing is of all of only one of the first and second capacitor electrode-forming materials.

17. The method of claim 14 wherein the removing is of only some of at least one of the first and second capacitor electrode-forming materials.

18. The method of claim 17 wherein the removing is of only some of only one of the first and second capacitor electrode-forming materials.

19. The method of claim 14 wherein one of the first and second capacitor electrode-forming materials is insulative, and the other of the first and second capacitor electrode-forming materials is at least one of conductive and semiconductive.

20. The method of claim 19 wherein the other is semiconductive.

21. The method of claim 19 wherein the one comprises silicon dioxide and the other comprises polysilicon.

22. The method of claim 14 wherein the retaining structure is provided prior to forming the capacitor electrodes within the capacitor electrode openings.

23. The method of claim 22 wherein the retaining structure is provided prior to forming the plurality of capacitor electrode openings.

24. The method of claim 14 comprising providing a plurality of the retaining structures at different elevations from the one elevation.

25. The method of claim 14 wherein the retaining structure is insulative and comprises a part of a finished circuitry construction incorporating the plurality of capacitors.

26. The method of claim 14 wherein no portion of the retaining structure comprises a part of a finished circuitry construction incorporating the plurality of capacitors.

27. The method of claim 14 wherein the retaining structure comprises a lattice.

28. The method of claim 14 wherein the individual capacitor electrodes are supported at least in part by at least one of the first and second capacitor electrode-forming materials in a finished circuitry construction incorporating the plurality of capacitors.

29. The method of claim 28 wherein the individual capacitor electrodes are supported at least in part by only one of the first and second capacitor electrode-forming materials in the finished circuitry construction.

30. The method of claim 28 wherein the individual capacitor electrodes are supported at least in part by both of the first and second capacitor electrode-forming materials in the finished circuitry construction.

31. The method of claim 14 wherein the individual capacitor electrodes are not supported by any of the first and second capacitor electrode-forming materials in a finished circuitry construction incorporating the plurality of capacitors.

32. A method of forming a plurality of capacitors, comprising:

forming a plurality of capacitor electrode openings over a semiconductor substrate, individual of the capacitor electrode openings being bounded on a first pair of opposing sides by a first capacitor electrode-forming material at one elevation and on a second pair of opposing sides by a different second capacitor electrode-forming material at the one elevation;

forming individual capacitor electrodes within individual of the capacitor electrode openings;

providing a retaining structure comprising a lattice at another elevation supportive of a plurality of the individual capacitor electrodes, the retaining structure comprising material different from both of the first and second capacitor electrode-forming materials, wherein cross pieces of the lattice intersect one another at about 90°;

after forming the capacitor electrodes, removing at least some of at least one of the first and second capacitor electrode-forming materials to expose opposing outer lateral sidewall surface portions of the capacitor electrodes; and incorporating the capacitor electrodes into a plurality of capacitors.

* * * * *